US010111362B2

(12) United States Patent
Tsai

(10) Patent No.: US 10,111,362 B2
(45) Date of Patent: Oct. 23, 2018

(54) LIQUID-COOLING HEAT DISSIPATION DEVICE

(71) Applicant: COOLER MASTER CO., LTD., New Taipei (TW)

(72) Inventor: Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 350 days.

(21) Appl. No.: 14/883,619

(22) Filed: Oct. 15, 2015

(65) Prior Publication Data

US 2017/0055370 A1 Feb. 23, 2017

(30) Foreign Application Priority Data

Aug. 20, 2015 (TW) ............................ 104213419 U

(51) Int. Cl.

*F28F 7/00* (2006.01)
*H05K 7/20* (2006.01)
*H01L 23/473* (2006.01)

(52) U.S. Cl.

CPC ....... *H05K 7/20272* (2013.01); *H01L 23/473* (2013.01); *H01L 2924/0002* (2013.01)

(58) Field of Classification Search

CPC .............. H05K 7/20272; H01L 23/473; H01L 2924/0002
USPC ... 165/80.4, 104.28, 104.19, 104.31, 104.33, 165/151, 152, 153, 159
See application file for complete search history.

(56) References Cited

U.S. PATENT DOCUMENTS 8,250,877 B2 * 8/2012 Correa ............... H05K 7/20781 62/259.2
9,696,094 B2 * 7/2017 Aoki ..................... F28D 1/0476
9,818,671 B2 * 11/2017 Huang .................. H01L 23/427
9,907,207 B1 * 2/2018 Wu .................... H05K 7/20272
9,921,002 B2 * 3/2018 Suzuki .................. F28D 1/0476
2005/0083656 A1 * 4/2005 Hamman ................ F28D 15/00 361/699
2005/0168939 A1 * 8/2005 Iijima ................. F28D 1/05375 361/679.47
2005/0224212 A1 * 10/2005 East ....................... B23K 20/02 165/80.4
2006/0011326 A1 * 1/2006 Yuval .................... F28D 1/0475 165/80.4
2006/0011332 A1 * 1/2006 Inoue ...................... F28F 13/10 165/166

(Continued)

*Primary Examiner* — Claire Rojohn, III
(74) *Attorney, Agent, or Firm* — Maschoff Brennan

(57) ABSTRACT

A liquid-cooling heat dissipation device includes: a flow guiding shell body (1) formed with a first flow channel (13), a second flow channel (14) and a third flow channel (15), wherein a heat dissipation space (16) is defined by the above-mentioned three flow channels (13, 14, 15); a primary pipe (2) disposed in the heat dissipation space (16) and extended from the first flow channel (13) towards the second flow channel (14), wherein the primary pipe (2) is communicated with the first flow channel (13); a plurality of secondary pipes (3) disposed in the heat dissipation space (16) and extended from the primary pipe (2) towards the third flow channel (15), wherein each of the secondary pipes (3) is respectively communicated with the primary pipe (2) and the third flow channel (15). Accordingly, advantages of lowering the flow resistance and increasing the heat dissipation performance can be achieved.

13 Claims, 6 Drawing Sheets

D3 D2 4 3 182 10 174 15 171 18 2 L1 D1 181 172 14 13 31 16 4 3 182 173 15 1

(56) References Cited

U.S. PATENT DOCUMENTS

2006/0021737 A1* 2/2006 Lee ........................ F28D 15/00 165/80.4
2006/0067052 A1* 3/2006 Llapitan .............. F28D 1/05375 361/700
2006/0131009 A1* 6/2006 Nies .................... F28D 1/05391 165/176
2007/0012423 A1* 1/2007 Kinoshita ............. H01L 23/473 165/80.4
2007/0023167 A1* 2/2007 Liu ....................... H01L 23/473 165/80.4
2007/0034353 A1* 2/2007 Liu ....................... H01L 23/473 165/80.4
2007/0034354 A1* 2/2007 Tung ..................... H01L 23/473 165/80.4
2007/0034355 A1* 2/2007 Kuo ........................ F28D 15/02 165/80.4
2007/0034356 A1* 2/2007 Kenny .................... F04B 17/00 165/80.4
2007/0062674 A1* 3/2007 Ippoushi ............... H01L 23/473 165/80.4
2007/0068653 A1* 3/2007 Kondou ................ F28D 1/0477 165/80.4
2008/0179041 A1* 7/2008 Hu ...................... F28D 1/05375 165/71
2008/0179044 A1* 7/2008 Hu ........................ H01L 23/473 165/80.4
2008/0179045 A1* 7/2008 Hu ........................ H01L 23/473 165/80.4
2009/0205809 A1* 8/2009 Wan .................... F28D 1/05366 165/80.4
2011/0132585 A1* 6/2011 Chen ..................... F28D 1/0478 165/152
2011/0139414 A1* 6/2011 Ghosh ..................... F28F 1/128 165/151
2011/0284186 A1* 11/2011 Hirai ..................... F28D 1/0461 165/104.19
2014/0043757 A1* 2/2014 Bernstein ................ H01L 23/38 361/689
2014/0126150 A1* 5/2014 Song ..................... H01L 23/473 361/699
2014/0252585 A1* 9/2014 Chen ..................... H01L 23/473 257/692
2015/0131229 A1* 5/2015 Matsunaga ........... H01L 23/427 361/700
2015/0184951 A1* 7/2015 Lee ........................... F28F 1/32 165/151
2015/0226495 A1* 8/2015 Park ........................ F28F 1/128 165/151
2015/0247678 A1* 9/2015 Tylutki ................ F28D 1/05325 165/103
2016/0013114 A1* 1/2016 Vadhavkar .............. H01L 23/34 257/713
2016/0025422 A1* 1/2016 Strange ................... B23P 15/26 165/168
2016/0061537 A1* 3/2016 Hunt ....................... F28F 1/128 165/151
2016/0138872 A1* 5/2016 Jiang ..................... F28F 9/0224 165/151
2016/0143189 A1* 5/2016 Campbell .......... H05K 7/20436 165/185
2016/0216041 A1* 7/2016 Cheng ................... F28D 15/025
2016/0216048 A1* 7/2016 Tsai .......................... F28F 3/02
2016/0366787 A1* 12/2016 Liao ................... H05K 7/20272
2016/0366788 A1* 12/2016 Liao ................... H05K 7/20272
2017/0014929 A1* 1/2017 So ........................ B23K 1/0016
2017/0045307 A1* 2/2017 Tsai .......................... F28F 3/02
2017/0079161 A1* 3/2017 Tsai ...................... G06F 1/1632
2017/0115708 A1* 4/2017 Tivadar .............. H05K 7/20263
2017/0181319 A1* 6/2017 Agostini ............... F28D 15/025
2017/0257979 A1* 9/2017 Wu .................... H05K 7/20263
2017/0280589 A1* 9/2017 Tochiyama ........ H05K 7/20281
2017/0330819 A1* 11/2017 Tao ........................ F25B 39/00

* cited by examiner

171
D1
13
181
16
L1
2
1
15
15
174
173
10
182
182
D2
3
3
D3
4
4
18
14
172
31

7
171
13
16
11
2
181
1
15
15
174
173
10

182
182
3
3
4
4
18
14
172

LIQUID-COOLING HEAT DISSIPATION DEVICE

BACKGROUND OF THE INVENTION

Field of the Invention

The present invention relates to a heat dissipation device, especially to a liquid-cooling heat dissipation device.

Description of Related Art

With the rapid developments and wilder applications of high tech products such as computer information related products, the data processing speed of a computing device is enabled to be faster. At present, there is a trend of having the volume of an internal electric component of the computing device being smaller, so the density of integrated circuit (IC) is correspondingly increased, and the heat generated per unit area is also increased. If the massive amount of heat generated by the electric component could not be timely dissipated, the electric component may be damaged and the computing device may not be normally operated.

For lowering the working temperature of a heat generating electric component, there is a liquid-cooling heat dissipation device available in the market, in which a pump is additionally installed in a general heat dissipation device, and at least two connectors are required for connecting the pump and the heat dissipation device for allowing a coolant to repeatedly perform a cooling circulation to rapidly dissipate the heat existed in the heat dissipation device.

However, the conventional liquid-cooling heat dissipation device is served to directly supplying the coolant to heat dissipation fins, the flow path of the coolant is not well planned and arranged, and the coolant is unable to evenly flow to each of the heat dissipation fins, so the flow path of the coolant is not smooth and often has a larger flow resistance, thereby causing the conventional liquid-cooling heat dissipation device to be provided with disadvantages of low flow amount of coolant and poor heat dissipation performance.

Accordingly, the applicant of the present invention has devoted himself for improving the mentioned disadvantages.

SUMMARY OF THE INVENTION

The present invention is to provide a liquid-cooling heat dissipation device, in which a coolant firstly flows through a primary pipe then is distributed to secondary pipes, so the flow path of the coolant is able to be well planned and arranged, and the coolant can be evenly and thermally connected to each heat dissipation fin, thereby enabling the liquid-cooling heat dissipation device to be provided with advantages of lowering the flow resistance and increasing the heat dissipation performance.

Accordingly, the present invention provides a liquid-cooling heat dissipation device, which includes: a flow guiding shell body, formed with a first fluid port and a second fluid port and formed with a first flow channel, a second flow channel and a third flow channel, wherein a heat dissipation space is defined by the first flow channel, the second flow channel and the third flow channel, the first flow channel and the second flow channel are arranged at two opposite sides of the heat dissipation space, the second flow channel is communicated with the third flow channel, the first flow channel is communicated with the first fluid port, and the second flow channel is communicated with the second fluid port; a primary pipe, installed in the heat dissipation space and extended from the first flow channel towards the second flow channel, wherein the primary pipe is communicated with the first flow channel; a plurality of secondary pipes, installed in the heat dissipation space and extended from the primary pipe towards the third flow channel, wherein each of the secondary pipes is respectively communicated with the primary pipe and the third flow channel; and a plurality of heat dissipation fins, disposed between every two of the adjacent secondary pipes.

DETAILED DESCRIPTION OF THE INVENTION

Preferred embodiments of the present invention will be described with reference to the drawings.

Figure 1:
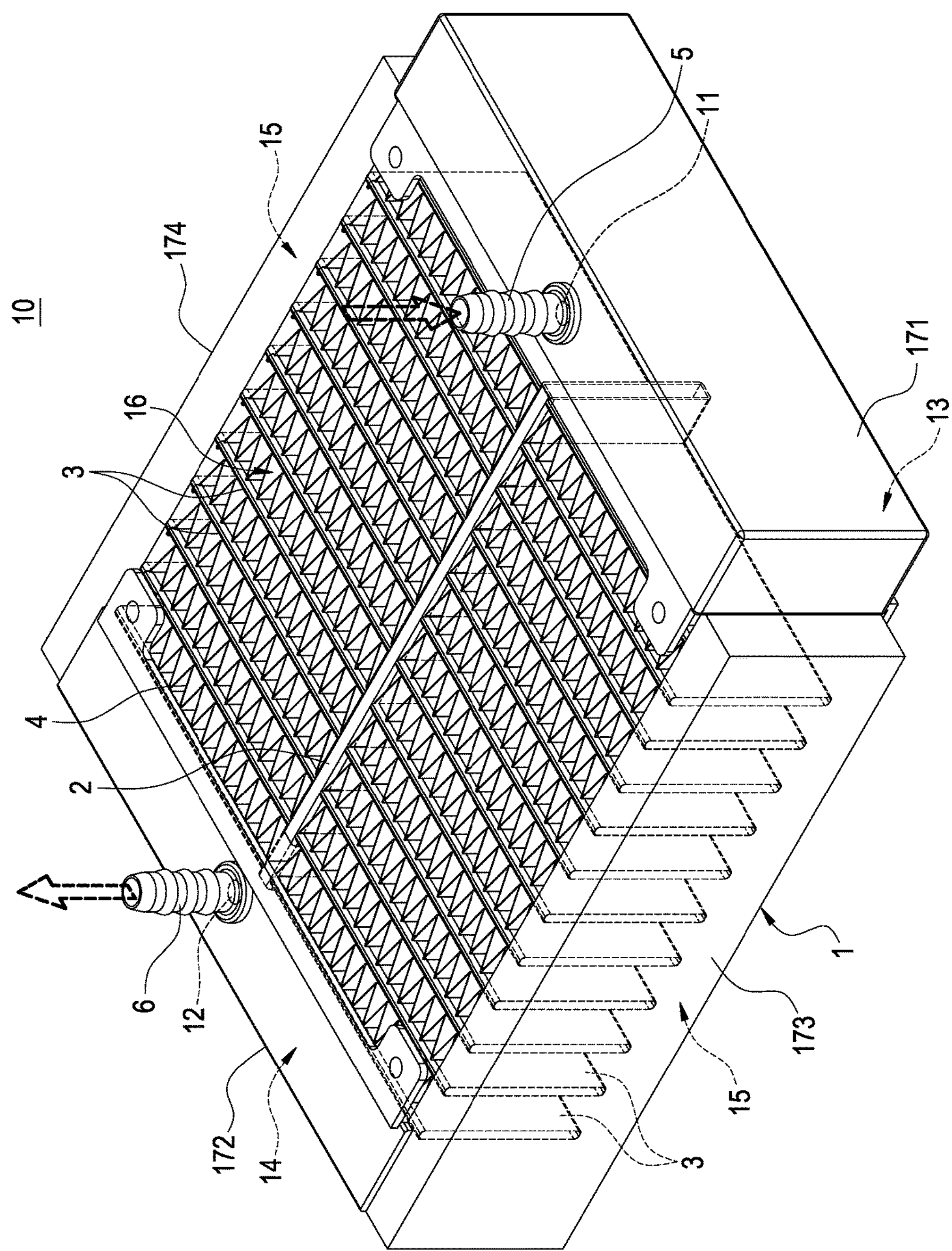
FIG. 1 is a perspective view showing the assembly of a liquid-cooling heat dissipation device according to a first embodiment of the present invention.
Figure 2:
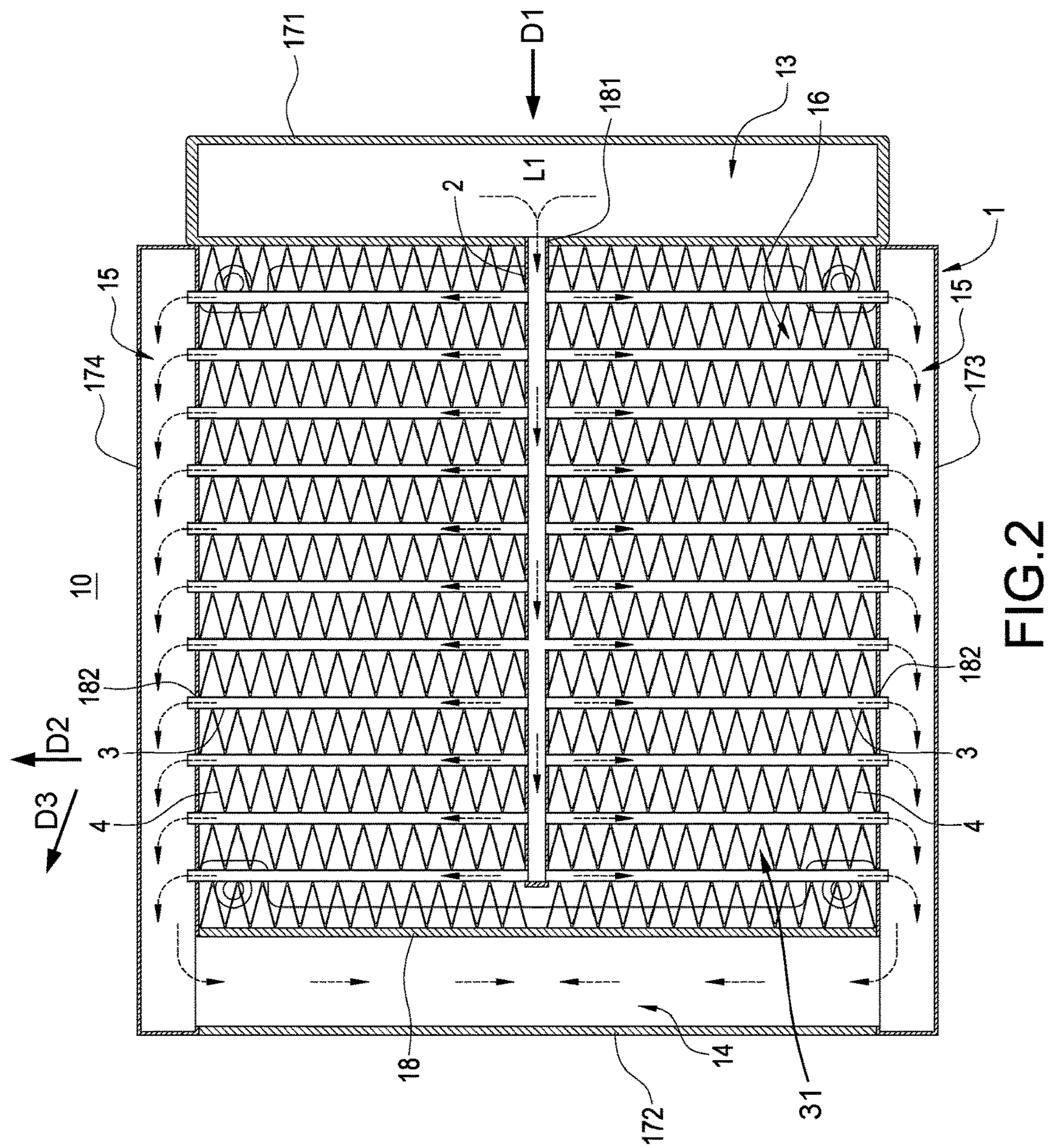
FIG. 2 is a cross sectional view showing the liquid-cooling heat dissipation device according to the first embodiment of the present invention.

Please refer to FIG. 1 to FIG. 2, the present invention provides a liquid-cooling heat dissipation device. According to a first embodiment of the present invention, the liquid-cooling heat dissipation device (10) mainly includes a flow guiding shell body (1), a primary pipe (2), a plurality of secondary pipes (3) and a plurality of heat dissipation fins (4).

The flow guiding shell body (1) is applied to a liquid-cooling radiator or a liquid-cooling head. In the following description, the flow guiding shell body is applied to a liquid-cooling radiator. The flow guiding shell body (1) is formed with a first fluid port (11) and a second fluid port (12). The flow guiding shell body (1) is formed with a first flow channel (13), a second flow channel (14) and at least one third flow channel (15), and a heat dissipation space (16) is defined by the first flow channel (13), the second flow channel (14) and the third flow channel (15) The first flow channel (13) and the second flow channel (14) are arranged at two opposite sides of the heat dissipation space (16), the second flow channel (14) is communicated with the third flow channel (15), the first flow channel (13) is communicated with the first fluid port (11), and the second flow channel (14) is communicated with the second fluid port (12). Wherein, according to this embodiment, there are two third flow channels (15), and the two third flow channels (15) are arranged at other opposite sides of the heat dissipation space (16).

In addition, according to this embodiment, the flow guiding shell body (1) is formed as a rectangular shell body, but what shall be addressed is that the scope of the present invention is not limited by the above-mentioned arrangement, the flow guiding shell body (1) shall also be formed as a circular, triangular, pentagonal or other geometrical shell body.

Moreover, the flow guiding shell body (1) is further formed with a front wall (171), a rear wall (172), a left wall (173) and a right wall (174). The first flow channel (13) is disposed at an inner side of the front wall (171), the second flow channel (14) is disposed at an inner side of the rear wall (172), one of the third flow channels (15) is disposed at an inner side of the left wall (173), and the other third flow channel (15) is disposed at an inner side of the right wall (174).

Furthermore, the flow guiding shell body (1) is further formed with a partition plate (18), and the partition plate (18) surrounds the outer periphery of the heat dissipation space (16) with an enclosing means. The partition plate (18) is formed with a first through hole (181) and a plurality of second through holes (182), the first through hole (181) is communicated with the first flow channel (13), and each of the second through holes (182) is communicated with the third flow channel (15).

The primary pipe (2) is installed in the heat dissipation space (16), and the primary pipe (2) is extended from the first flow channel (13) towards the second flow channel (14). One end of the primary pipe (2) is sealed, and the other end thereof passes the first through hole (181), thereby enabling the primary pipe (2) to be communicated with the first flow channel (13).

Each of the secondary pipes (3) is installed in the heat dissipation space (16) and respectively extended from the primary pipe (2) towards the third flow channel (15). One distal end of the secondary pipe (3) passes the corresponding second through hole (182), so that two ends of the secondary pipe (3) are respectively communicated with the primary pipe (2) and the third flow channel (15).

In addition, each of the secondary pipes (3) is perpendicular to the primary pipe (2), and the primary pipe (2) is perpendicular to the first flow channel (13) or the second flow channel (14). Moreover, the plural heat dissipation fins (4) are disposed between every two of the adjacent secondary pipes (3), and the heat dissipation fins (4) are arranged to be thermally connected to the secondary pipes (3). Specifically, the primary pipe (2) extends in an extension direction (D1), each secondary pipe (3) extends in an extension direction (D2), and each heat dissipation fin (4) extends in, for example, an extension direction (D3), as shown in FIG. 2, the primary pipe (2), the secondary pipes (3) and the heat dissipation fins (4) extend in different directions. In addition, the secondary pipes (3) are spaced apart from one another and each is a plate-shaped pipe. Thus, two of the secondary pipes (3) adjacent to each other have a gap (31) therebetween, the gaps (31) are arranged along the extension direction (D1) of the primary pipe (2) (that is, the gaps (31) are arranged along a direction extending from the first flow channel (13) towards the second flow channel (14)), and the heat dissipation fins (4) are disposed in the gaps (31).

According to the present invention, the liquid-cooling heat dissipation device (10) further includes a first guiding connector (5) and a second guiding connector (6), the first guiding connector (5) is fastened with and communicated with the first fluid port (11), and the second guiding connector (6) is fastened with and communicated with the second fluid port (12).

According to the present invention, the assembly of the liquid-cooling heat dissipation device (10) is illustrated as follows: the flow guiding shell body (1) is formed with the first fluid port (11) and the second fluid port (12) and also formed with the first flow channel (13), the second flow channel (14) and the third flow channel (15), the heat dissipation space (16) is defined by the first flow channel (13), the second flow channel (14) and the third flow channel (15), the first flow channel (13) and the second flow channel (14) are disposed in the two opposite sides of the heat dissipation space (16), the second flow channel (14) is communicated with the third flow channel (15), the first flow channel (13) is communicated with the first fluid port (11), the second flow channel (14) is communicated with the second fluid port (12); the primary pipe (2) is installed in the heat dissipation space (16) and extended from the first flow channel (13) towards the second flow channel (14), and the primary pipe (2) is communicated with the first flow channel (13); each of the secondary pipes (3) is installed in the heat dissipation space (16) and respectively extended from the primary pipe (2) towards the third flow channel (15), and each of the secondary pipes (3) is respectively communicated with the primary pipe (2) and the third flow channel (15); the heat dissipation fins (4) are disposed between every two of the adjacent secondary pipes (3). Accordingly, a coolant is allowed to firstly flow through the primary pipe (2) then flow to the secondary pipes (3), so the flow path of the coolant is able to be well planned and arranged, and the coolant can be evenly and thermally connected to each of the heat dissipation fins (4), thereby enabling the liquid-cooling heat dissipation device (10) to be provided with advantages of lowering the flow resistance and increasing the heat dissipation performance.

According to the present invention, the operating status of the liquid-cooling heat dissipation device (10) is illustrated as follows: a pump (not shown in figures) is externally connected for enabling the coolant to be guided into the first fluid port (11) from the first guiding connector (5), the coolant flows to the primary pipe (2) from the first flow channel (13), then the coolant is distributed to the secondary pipes (3), lastly the coolant flows to the second flow channel (14) from the third flow channel (15), and the coolant inside the second flow channel (14) is discharged through the second fluid port (12) and the second guiding connector (6), so a circulating heat dissipation loop is established.

On the other hand, the pump (not shown in figures) can also be used for guiding the coolant into the second fluid port (12) from the second guiding connector (6), the coolant flows to the third flow channel (15) from the second flow channel (14), then the coolant is gathered by the secondary pipes (3) and flows to the primary pipe (2), lastly the coolant inside the first flow channel (13) is discharged through the first fluid port (11) and the first guiding connector (5), so a circulating heat dissipation loop is established.

Accordingly, the primary pipe (2) and the secondary pipes (3) are utilized for well planning and arranging the flow path of the coolant thereby effectively lowering the flow resistance of the coolant, and the plural heat dissipation fins (4) are connected at the exteriors of the secondary pipes (3), so the coolant is able to be evenly and thermally connected to each of the heat dissipation fins (4), thereby enabling the liquid-cooling heat dissipation device (10) to be provided with advantages of lowering the flow resistance and increasing the heat dissipation performance.

Figure 3:
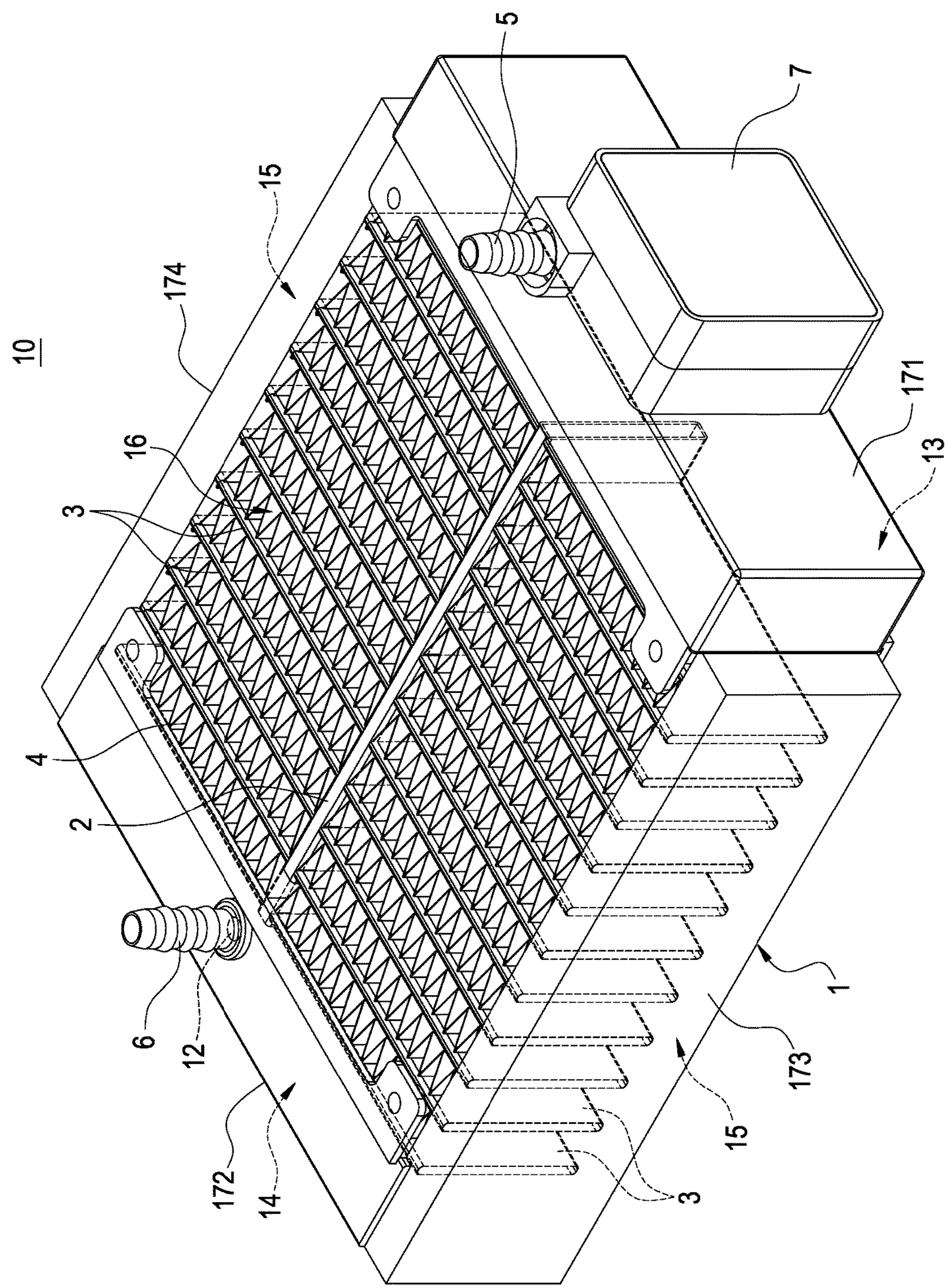
FIG. 3 is a perspective view showing the assembly of the liquid-cooling heat dissipation device according to a second embodiment of the present invention.
Figure 4:
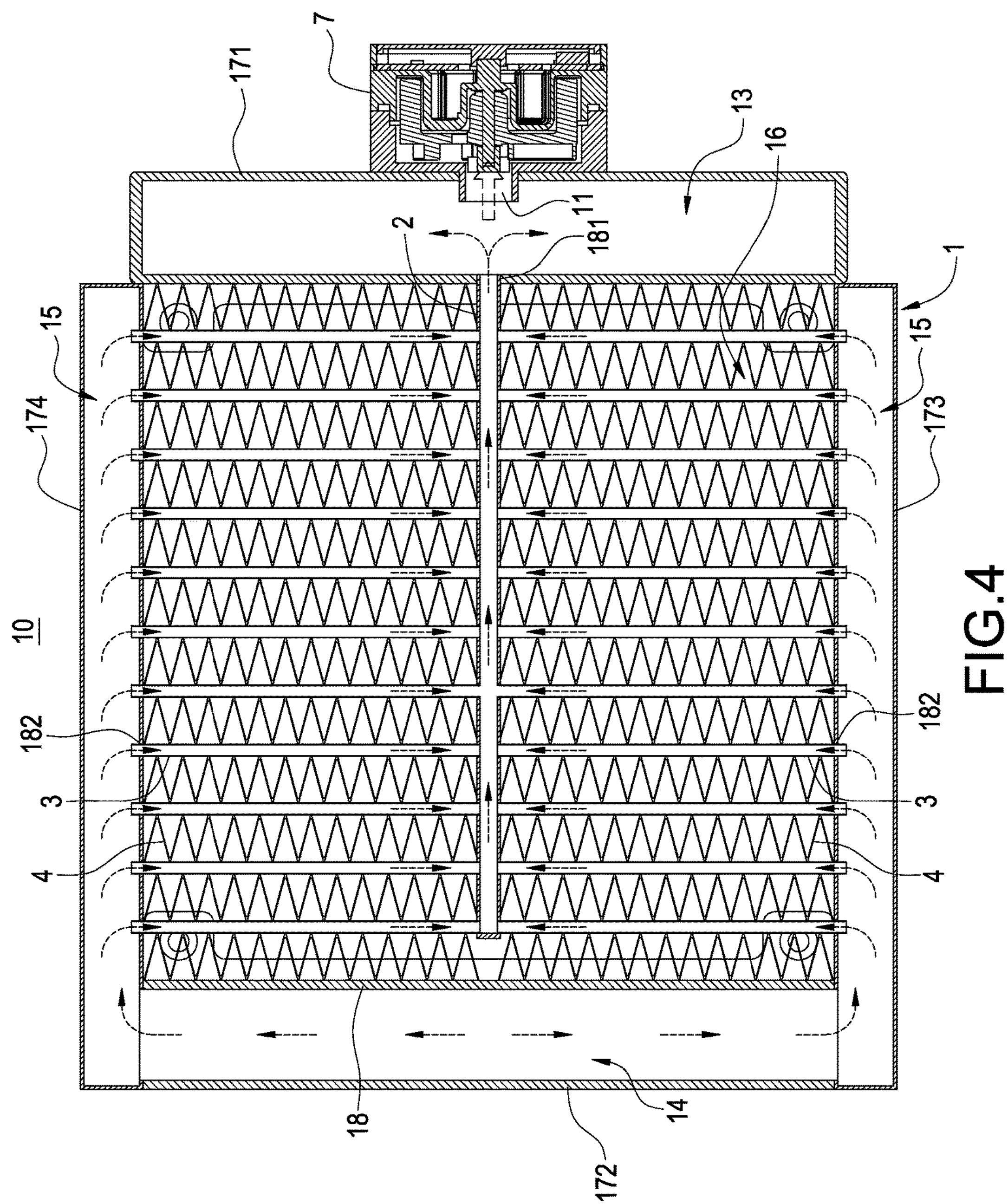
FIG. 4 is a cross sectional view showing the liquid-cooling heat dissipation device according to the second embodiment of the present invention.

Please refer to FIG. 3 and FIG. 4, which discloses a second embodiment of the liquid-cooling heat dissipation device (10) provided by the present invention; the second embodiment is substantially the same as the first embodiment, and the difference between the second embodiment and the first embodiment is that the liquid-cooling heat dissipation device (10) further includes an outtake pump (7).

Details are provided as follows. According to the second embodiment, the outtake pump (7) is fastened with and communicated with the first fluid port (11), the first guiding connector (5) is fastened with and communicated with the outtake pump (7), and the second guiding connector (6) is fastened with and communicated with the second fluid port (12). Accordingly, the outtake pump (7) is able to suck the coolant inside the flow guiding shell body (1) to the exterior, so the coolant is able to be guided into the second fluid port (12) from the second guiding connector (6), the coolant flows to the third flow channel (15) from the second flow channel (14), then the coolant is gathered by the secondary pipes (3) and flows to the primary pipe (2), lastly the coolant inside the first flow channel (13) is discharged through the first fluid port (11) and the first guiding connector (5). Thus, the same functions and effects provided by the first embodiment can also be achieved.

Figure 5:
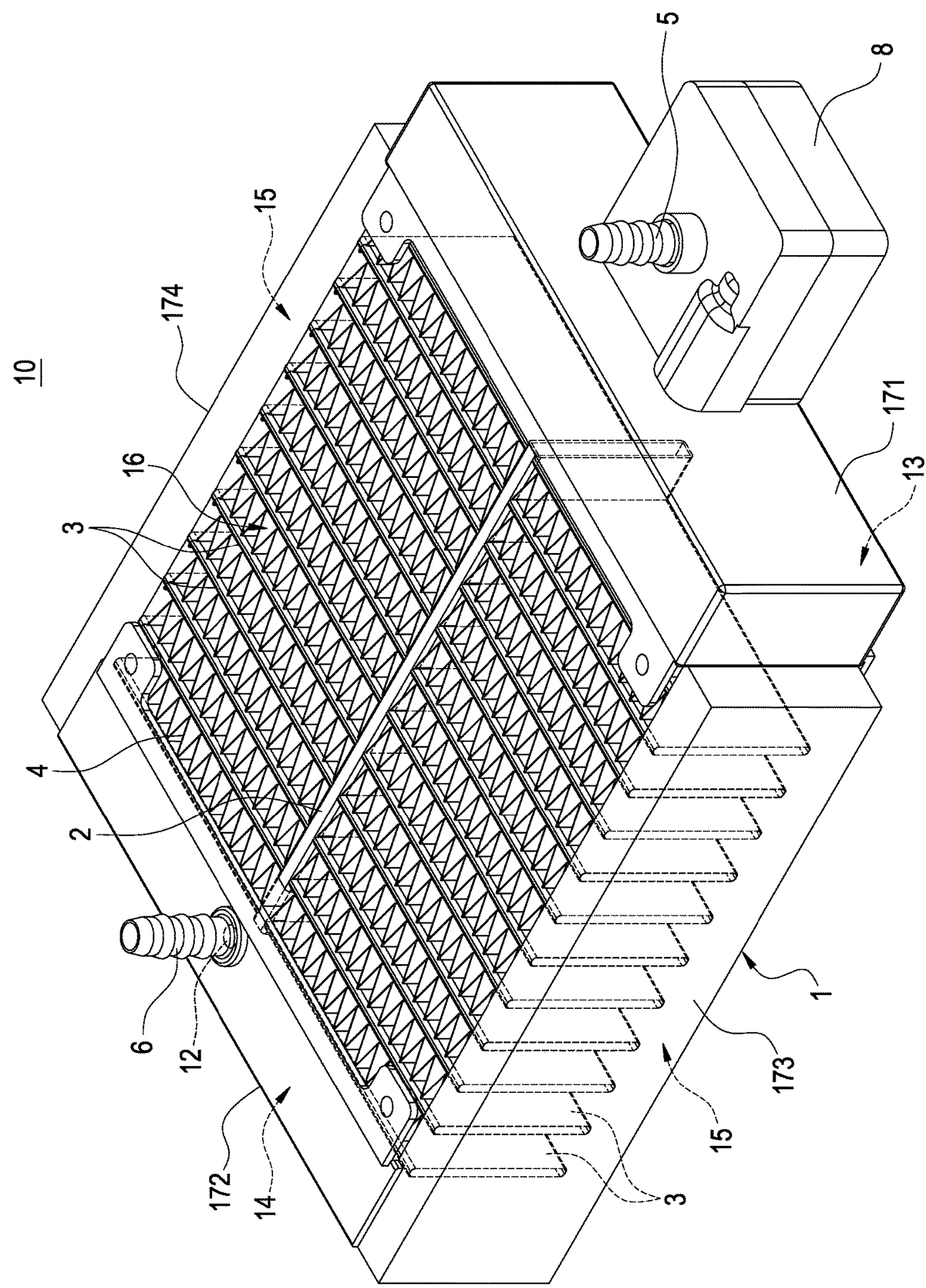
FIG. 5 is a perspective view showing the assembly of the liquid-cooling heat dissipation device according to a third embodiment of the present invention.
Figure 6:
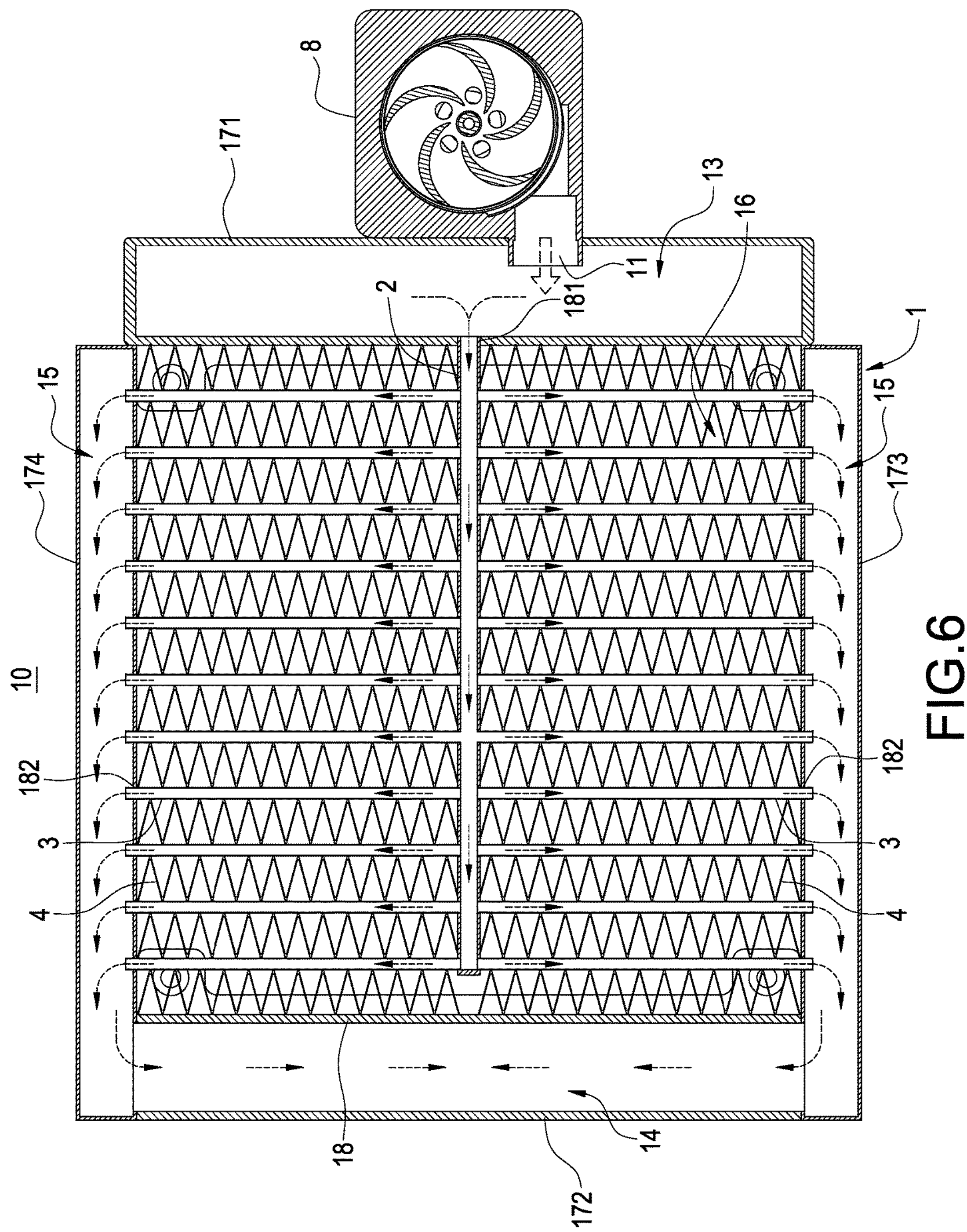
FIG. 6 is a cross sectional view showing the liquid-cooling heat dissipation device according to the third embodiment of the present invention.

Please refer to FIG. 5 and FIG. 6, which discloses a third embodiment of the liquid-cooling heat dissipation device (10) provided by the present invention; the third embodiment is substantially the same as the first embodiment, and the difference between the third embodiment and the first embodiment is that the liquid-cooling heat dissipation device (10) further includes an intake pump (8).

Details are provided as follows. According to the third embodiment, the intake pump (8) is fastened with and communicated with the first fluid port (11), the first guiding connector (5) is fastened with and communicated with the intake pump (8), and the second guiding connector (6) is fastened with and communicated with the second fluid port (12). Accordingly, the intake pump (8) is able to suck the external coolant into the flow guiding shell body (1), then the coolant is guided into the first fluid port (11) from the first guiding connector (5), the coolant flows to the primary pipe (2) from the first flow channel (13), then the coolant is distributed to the secondary pipes (3), the coolant flows to the second flow channel (14) from the third flow channel (15), and lastly the coolant inside the second flow channel (14) is discharged through the second fluid port (12) and the second guiding connector (6). Thus, the same functions and effects provided by the first embodiment can also be achieved.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A liquid-cooling heat dissipation device, including:

a flow guiding shell body, formed with a first fluid port and a second fluid port, and formed with a first flow channel, a second flow channel and a third flow channel, wherein a heat dissipation space is defined by the first flow channel, the second flow channel and the third flow channel, the first flow channel and the second flow channel are arranged at two opposite sides of the heat dissipation space, the second flow channel is communicated with the third flow channel, the first flow channel is communicated with the first fluid port, and the second flow channel is communicated with the second fluid port;

a single primary pipe, installed in the heat dissipation space and extended from the first flow channel towards the second flow channel, wherein the primary pipe is communicated with the first flow channel;

a plurality of secondary pipes, installed in the heat dissipation space and extended from the primary pipe towards the third flow channel, wherein the primary pipe is located in a central area of the secondary pipes, and wherein each of the secondary pipes is respectively communicated with the primary pipe and the third flow channel; and a plurality of heat dissipation fins, disposed at two opposite sides of each of the plurality of secondary pipes, wherein each of the plurality of heat dissipation fins extends in a direction different from an extension direction of the primary pipe and an extension direction of each of the plurality of secondary pipes, and every two of the plurality secondary pipes which are adjacent to each other have a gap, the gaps of the plurality of secondary pipes are located at two opposite sides of the primary pipe and arranged along an extension direction of the primary pipe; and a plurality of heat dissipation fins, disposed in the gaps of the plurality of secondary pipes.

2. The liquid-cooling heat dissipation device according to claim 1, wherein there are two third flow channels, and the two third flow channels are arranged at other opposite sides of the heat dissipation space.

3. The liquid-cooling heat dissipation device according to claim 2, wherein the flow guiding shell body is further formed with a front wall, a rear wall, a left wall and a right wall, the first flow channel is disposed at an inner side of the front wall, the second flow channel is disposed at an inner side of the rear wall, one of the third flow channels is disposed at an inner side of the left wall, and the other third flow channel is disposed at an inner side of the right wall.

4. The liquid-cooling heat dissipation device according to claim 1, wherein the flow guiding shell body is further formed with a partition plate, and the partition plate surrounds an outer periphery of the heat dissipation space, the partition plate is formed with a first through hole communicated with the first flow channel, one end of the primary pipe is sealed, and the other end thereof passes the first through hole, the partition plate is formed with a plurality of second through holes communicated with the third flow channel, and one distal end of the secondary pipe passes the corresponding second through hole.

5. The liquid-cooling heat dissipation device according to claim 1, wherein each of the secondary pipes is perpendicular to the primary pipe.

6. The liquid-cooling heat dissipation device according to claim 1, wherein the primary pipe is perpendicular to the first flow channel or the second flow channel.

7. The liquid-cooling heat dissipation device according to claim 1, further including a first guiding connector and a second guiding connector, wherein the first guiding connector is fastened with and communicated with the first fluid port, and the second guiding connector is fastened with and communicated with the second fluid port.

8. The liquid-cooling heat dissipation device according to claim 1, further including a first guiding connector, a second guiding connector and an outtake pump, wherein the outtake pump is fastened with and communicated with the first fluid port, the first guiding connector is fastened with and communicated with the outtake pump, and the second guiding connector is fastened with and communicated with the second fluid port.

9. The liquid-cooling heat dissipation device according to claim 1, further including a first guiding connector, a second guiding connector and an intake pump, wherein the intake pump is fastened with and communicated with the first fluid port, the first guiding connector is fastened with and communicated with the intake pump, and the second guiding connector is fastened with and communicated with the second fluid port.

10. The liquid-cooling heat dissipation device according to claim 1, wherein two of the plurality of secondary pipes adjacent to each other have a gap therebetween, the plurality of heat dissipation fins are disposed in the gaps of the plurality of secondary pipes.

11. The liquid-cooling heat dissipation device according to claim 10, wherein the gaps of the plurality of secondary pipes are arranged along a direction extending from the first flow channel towards the second flow channel.

12. The liquid-cooling heat dissipation device according to claim 10, wherein the gaps of the plurality of secondary pipes are arranged along the extension direction of the primary pipe.

13. The liquid-cooling heat dissipation device according to claim 1, wherein the plurality of secondary pipes are spaced apart from one another and each is a plate-shaped pipe.

* * * * *